United States Patent [19]

Azuma et al.

[11] Patent Number: 5,759,746
[45] Date of Patent: Jun. 2, 1998

[54] FABRICATION PROCESS USING A THIN RESIST

[75] Inventors: Tsukasa Azuma, Poughkeepsie; Tokuhisa Ohiwa, Fishkill; Tetsuo Matsuda, Poughkeepsie; David M. Dobuzinsky, Hopewell Junction; Katsuya Okumura, Poughkeepsie, all of N.Y.

[73] Assignees: Kabushiki Kaisha Toshiba, Kawasaki, Japan; International Business Machines Corp., Armonk, N.Y.

[21] Appl. No.: 653,426

[22] Filed: May 24, 1996

[51] Int. Cl.$^6$ ................................. G03F 7/26
[52] U.S. Cl. ............... 430/313; 430/317; 156/659.11; 216/41
[58] Field of Search ................ 430/313, 317, 430/318; 216/13, 41; 156/659.11

[56] References Cited

U.S. PATENT DOCUMENTS

| | | | |
|---|---|---|---|
| 4,053,350 | 10/1977 | Olsen et al. | 156/659 |
| 4,426,767 | 1/1984 | Swanson et al. | 29/571 |
| 4,620,898 | 11/1986 | Banks et al. | 156/643 |
| 4,704,342 | 11/1987 | Lehrer et al. | 430/5 |
| 4,975,144 | 12/1990 | Yamazaki et al. | 156/643 |
| 5,017,264 | 5/1991 | Yamazaki | 156/643 |
| 5,022,959 | 6/1991 | Itoh et al. | 156/643 |
| 5,102,498 | 4/1992 | Itoh et al. | 156/659.1 |
| 5,185,293 | 2/1993 | Franke et al. | 437/184 |
| 5,240,554 | 8/1993 | Hori et al. | 156/643 |
| 5,445,710 | 8/1995 | Hori et al. | 156/643.1 |
| 5,498,571 | 3/1996 | Mori et al. | 437/189 |

*Primary Examiner*—Kathleen Duda
*Attorney, Agent, or Firm*—Banner & Witcoff, Ltd.

[57] ABSTRACT

A fabrication process includes a step of providing a substrate to be fabricated. A multi-layer antireflective layer is then formed on the substrate. A patterned resist having a thickness less than 850 nanometers is formed on the multi-layer antireflective layer and the substrate is fabricated using the patterned resist as a mask.

17 Claims, 18 Drawing Sheets

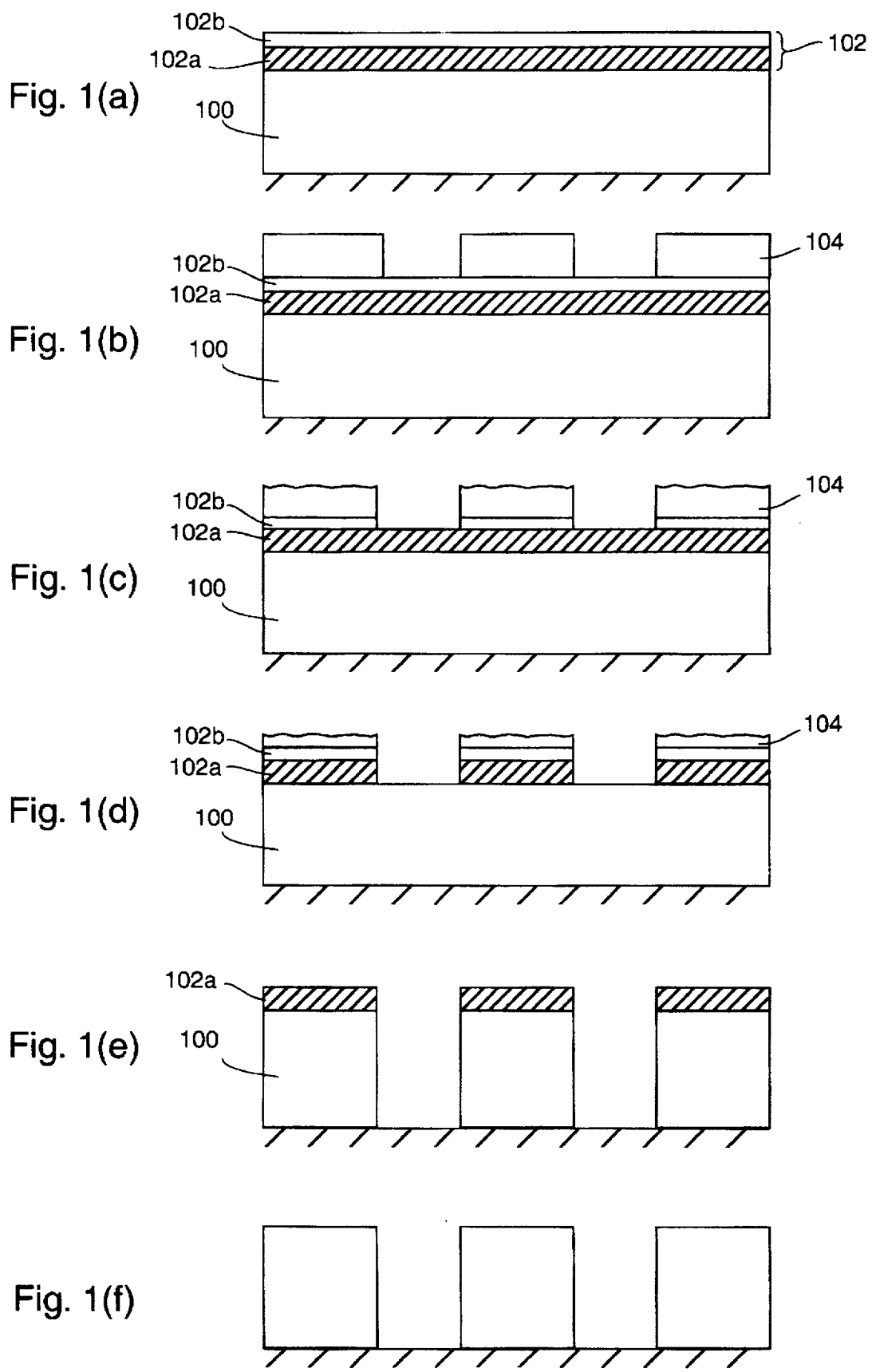

| | SPUTTER ⇐⇒ CVD | | | | |
|---|---|---|---|---|---|
| $C_{SPUTTERING}$ → | SiC → | SiCN → | SiN → | SiON → | $SiO_2$ |
| 201 | 205 | 207 | 209 | 211 | 213 |
| AMOUNT OF $N_2$ (%) | 0 | 80 | 90 | 40 | 0 |
| AMOUNT OF $SiH_4$ (%) | 100 | 20 | 10 | 10 | 10 |
| AMOUNT OF $O_2$ (%) | 0 | 0 | 0 | 50 | 90 |

REFRACTIVE INDEX AT 248nm SINGLE BAND LIGHT

| | m | k |
|---|---|---|
| APEX–E | 1.757 | −0.009i |
| ORGANIC ARC | 1.948 | −0.263i |
| Si | 1.570 | −3.565i |
| 2–CARBON | 1.750 | −0.500i |
| $SiO_2$ | 1.508 | 0 |

Fig. 4(b) NO ARC

Fig. 5(b) 90 nm ARC

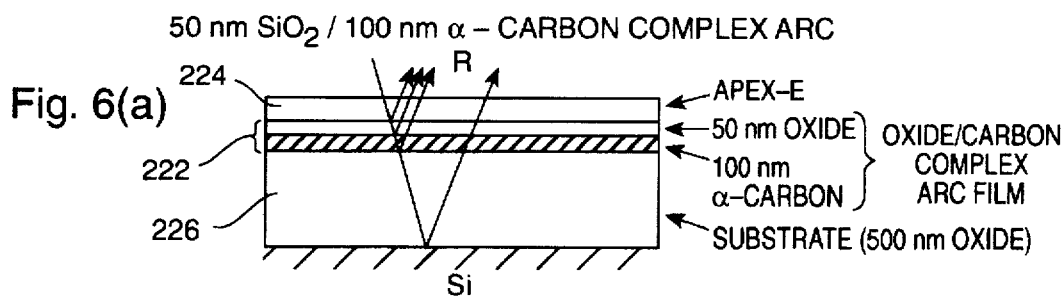
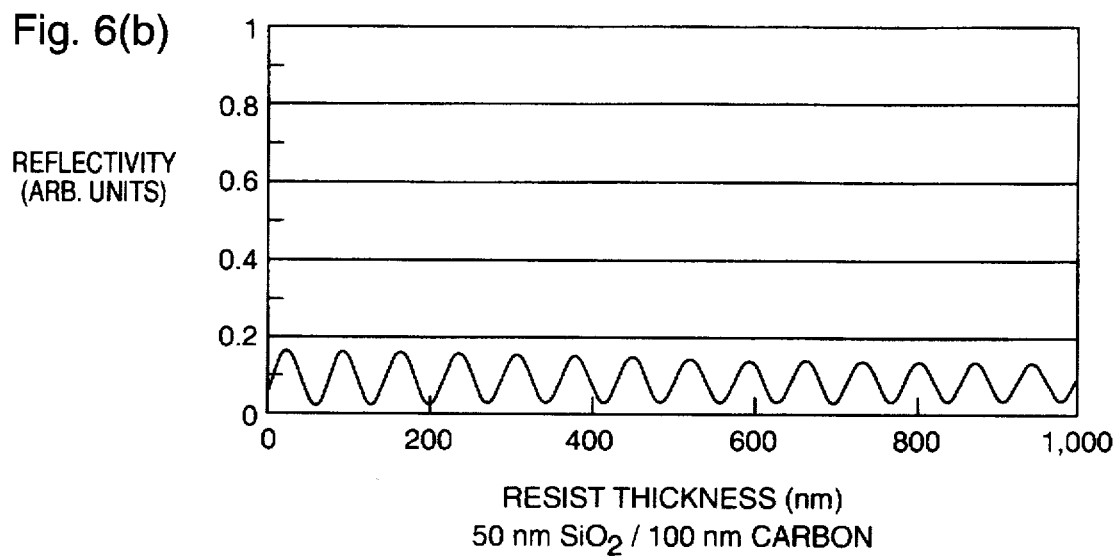
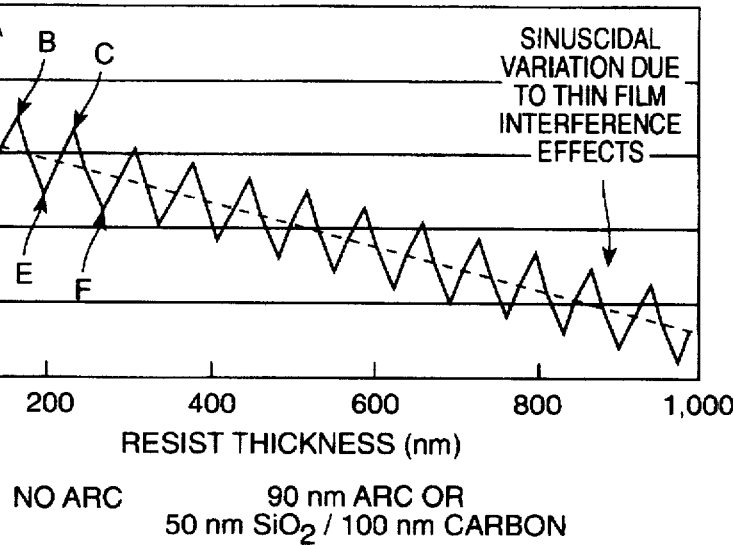

90 nm ORGANIC BOTTOM ARC AND MICRASCAN II

Fig. 9(a) SiO₂/CARBON COMPLEX ARC AND MICRASCAN II

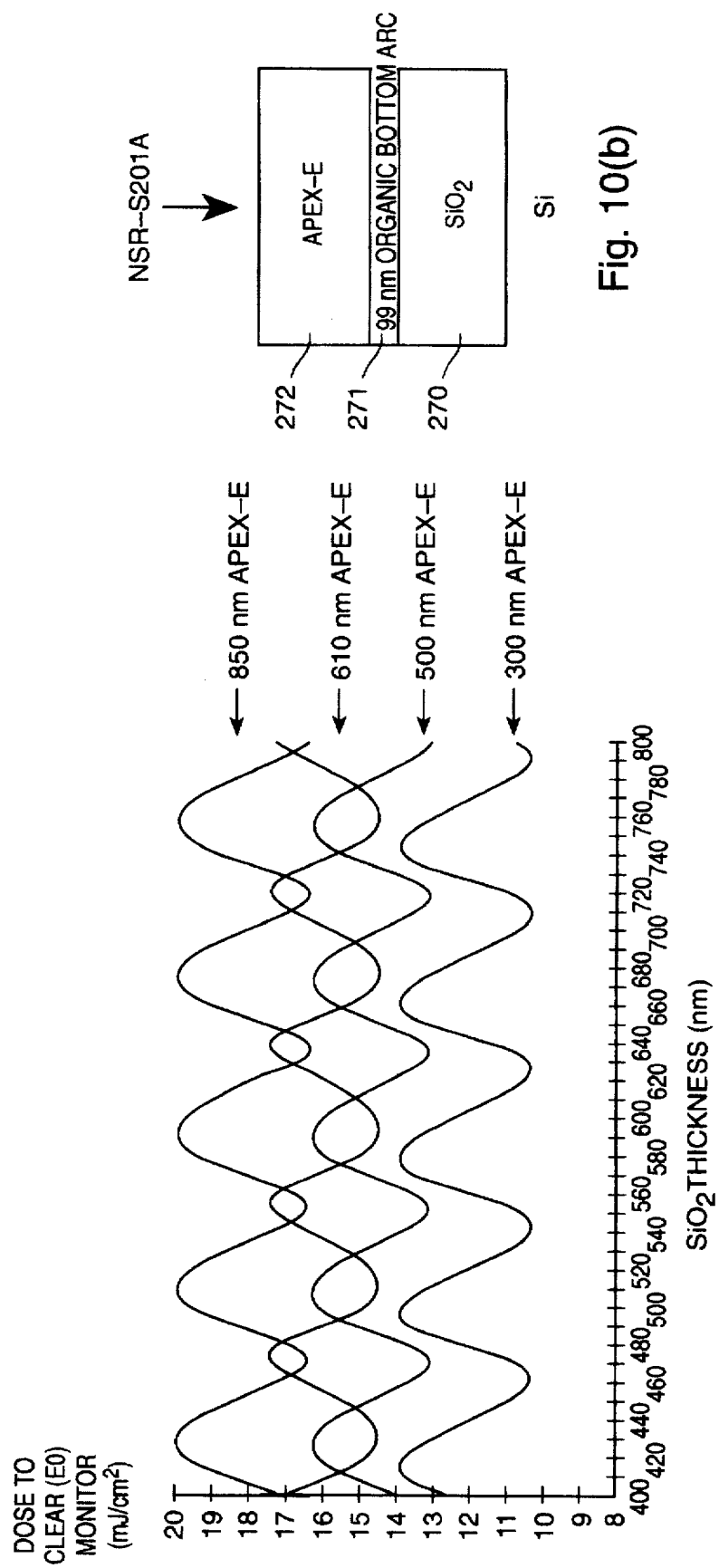

Fig. 12(a)　　　Fig. 12(b)
WAFER CENTER　　WAFER EDGE
(a) 610 nm
APEX-E
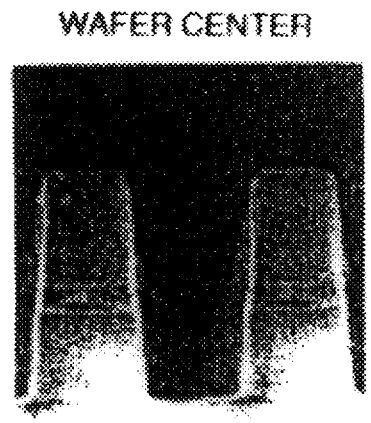
(b) 850 nm
APEX-E
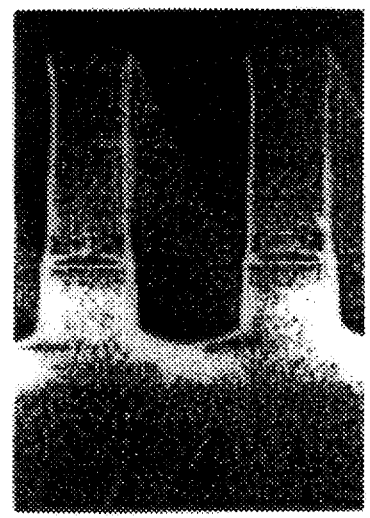
Fig. 12(c)　　　Fig. 12(d)

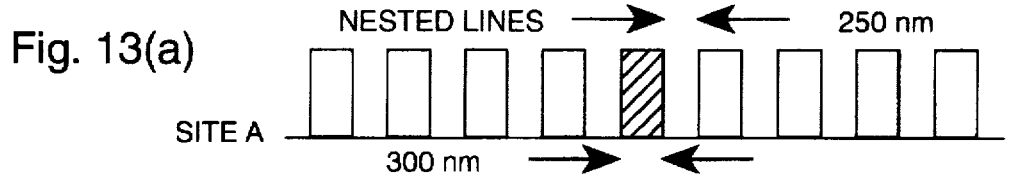
Fig. 13(a) SITE A
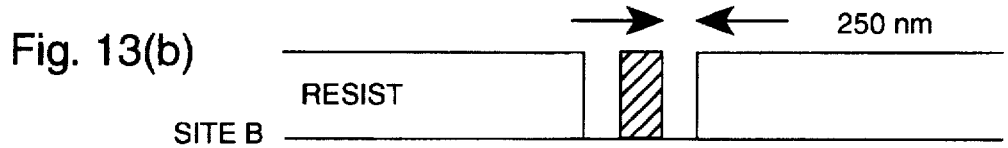
Fig. 13(b) SITE B
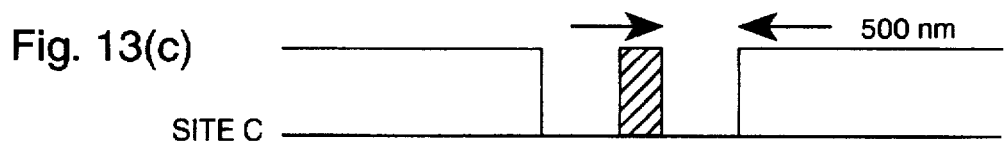
Fig. 13(c) SITE C
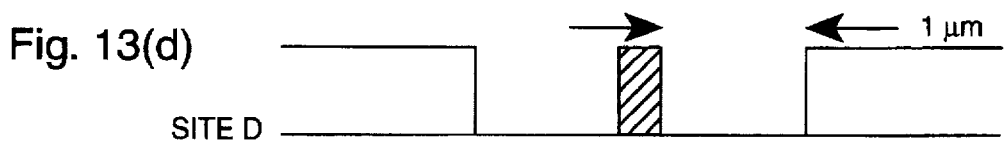
Fig. 13(d) SITE D
Fig. 13(e) SITE E
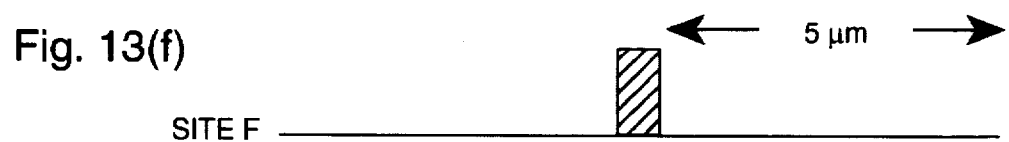
Fig. 13(f) SITE F
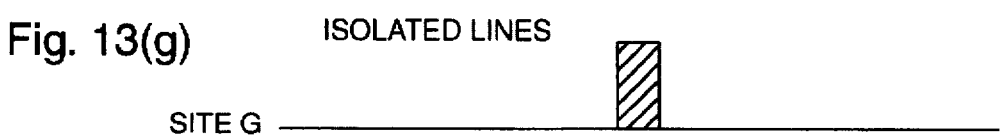
Fig. 13(g) SITE G (a) 610 nm APEX-E AND NSR-S201A (b) 610 nm UVIIHS AND NSR-S201A

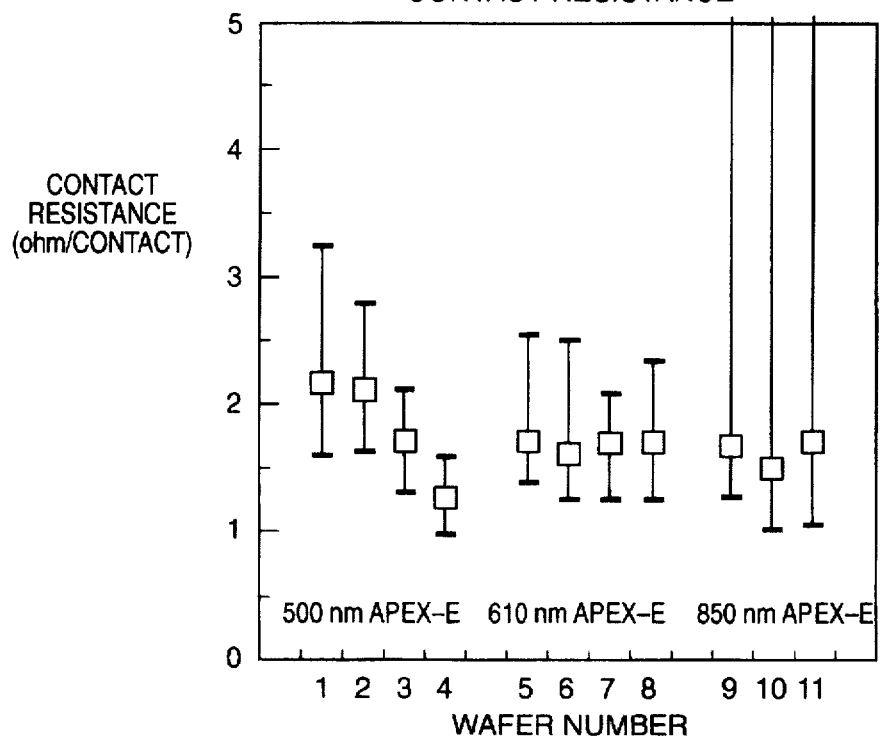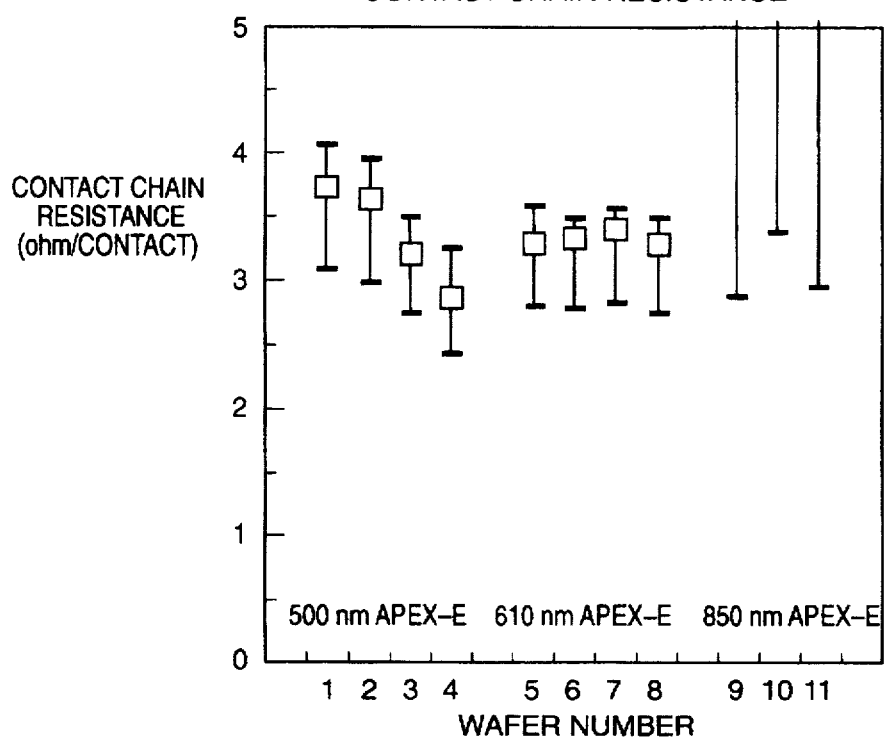

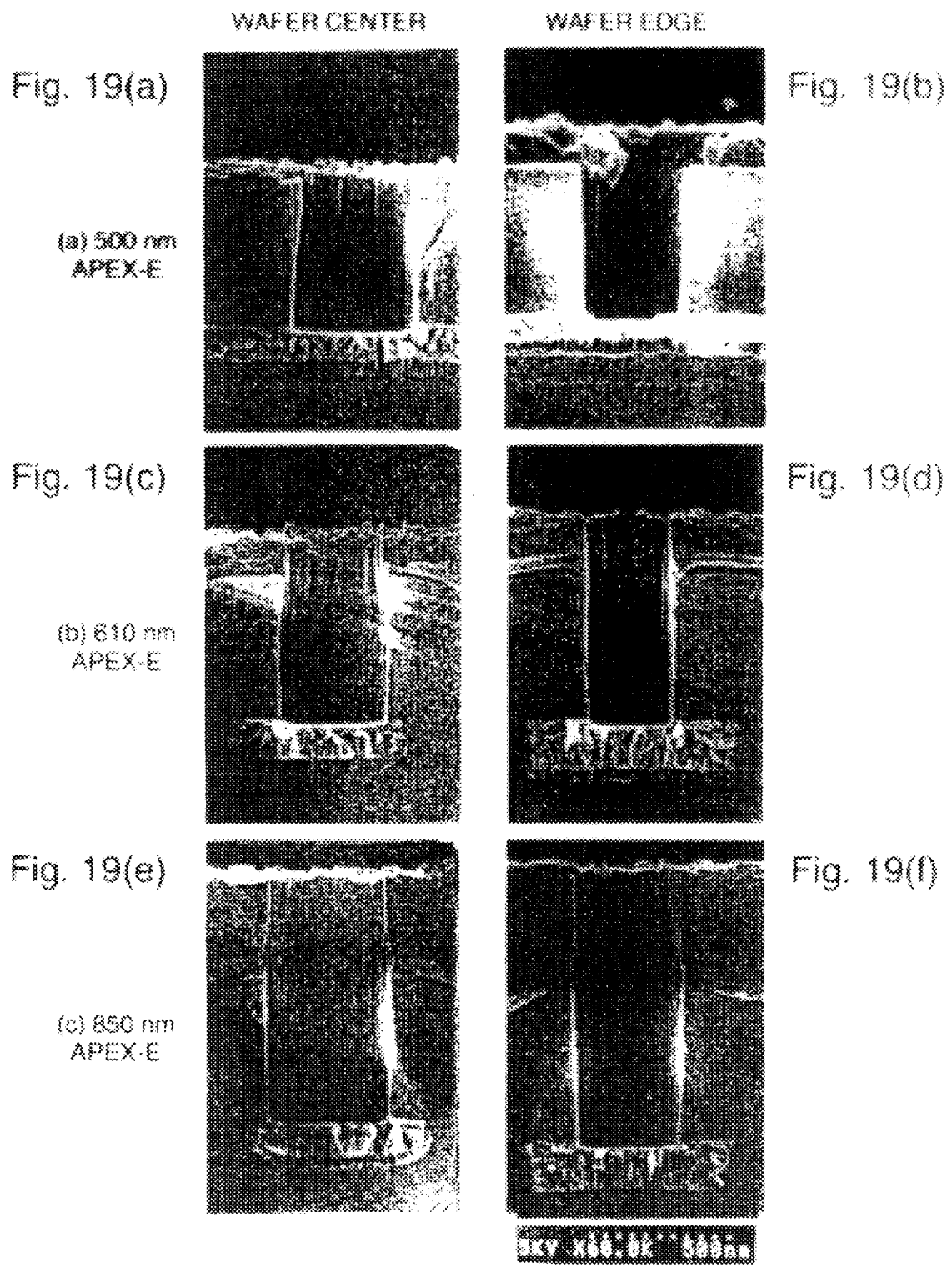

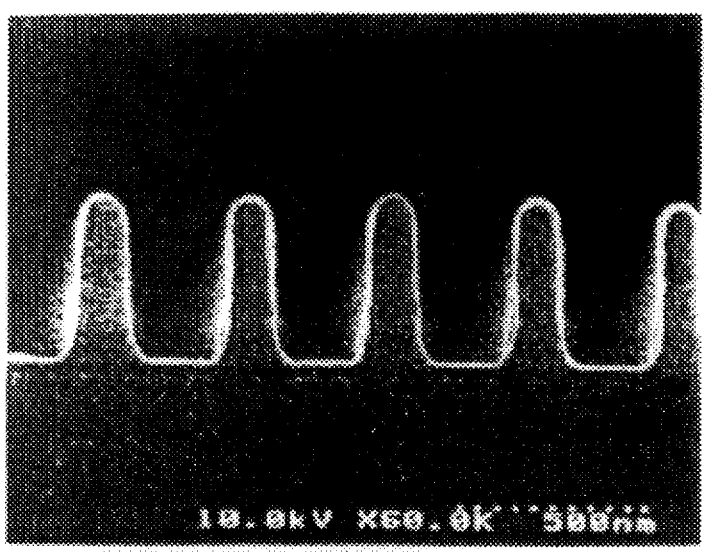
Fig. 20(a) (a) AFTER MICRASCAN II EXPOSURE
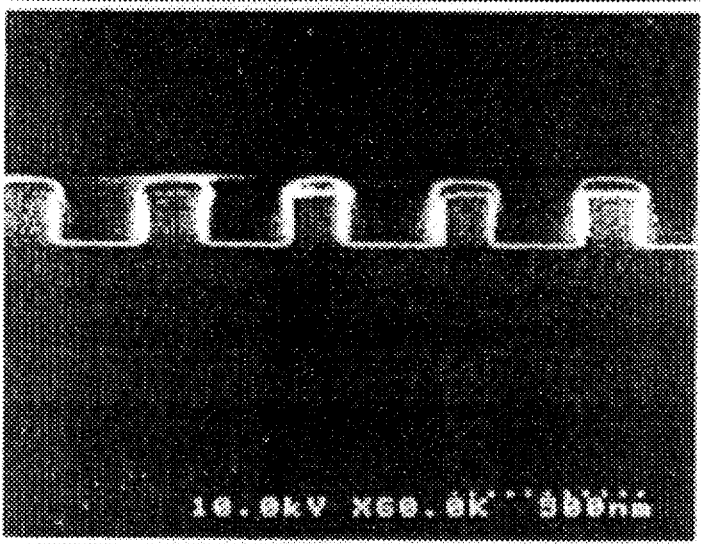
Fig. 20(b) (b) AFTER SiO₂/CARBON COMPLEX ARC ETCH
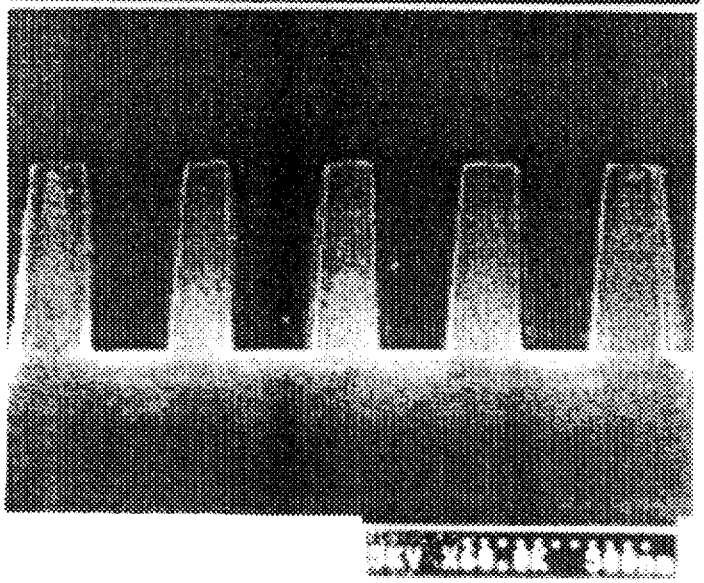
Fig. 20(c) (c) AFTER PATTERN TRANSFER

FABRICATION PROCESS USING A THIN RESIST

BACKGROUND OF THE INVENTION

1. Technical Field

The present invention generally relates to a fabrication process and, more particularly, to a fabrication process using a thin resist. The fabrication process is usable, for example, in manufacturing processes for manufacturing semiconductor integrated circuits such as semiconductor memory devices.

2. Description of Related Art

In the fabrication of semiconductor integrated circuits such as semiconductor memory devices, optical photofabrication techniques may be used to provide desired patterns for circuit features. These techniques typically involve the controlled projection of actinic light (e.g., ultraviolet (UV) radiation) in order to transfer a pattern from a photolithographic mask onto a layer of light-sensitive material such as a resist deposited on a semiconductor wafer. The mask typically embodies a light transmissive substrate with a layer of light blocking material defining the patterns of circuit features to be transferred to the resist coated wafer. If a negative resist is used, then the projected exposure light passing through the mask will cause the exposed areas of the resist layer to undergo polymerization and cross-linking, resulting in an increased molecular weight. In a subsequent development step, unexposed portions of the resist layer will wash off with the developer, leaving a pattern of resist material constituting a reverse or negative image of the mask pattern. Alternatively, if a positive resist is used, the exposure light passing through the mask will cause the exposed portions of the resist layer to become soluble to the developer, such that the exposed resist layer portions will wash away in the development step, leaving a pattern of resist material corresponding directly to the mask pattern. In both cases, the remaining resist will serve to define a pattern of exposed material that will undergo subsequent processing steps (e.g., etching and deposition) for forming the desired semiconductor devices. The exposed material may, for example, be an insulator, a conductor, or a semiconductor.

Two important parameters of a lithography system are resolution and depth of focus. Resolution is a measure of the ability of the system to form separate images of closely spaced objects. Using a quarter micron (0.25 µ) ground rule, the minimum resolution may be expressed using the conventional Rayleigh equation as:

$$R = K_1 \frac{\lambda}{NA} = 0.25 \qquad (1)$$

where R is the minimum resolution; $\lambda$ is the wavelength of the exposure light (e.g., $\lambda$=248 nanometers); NA is the numerical aperture (a lens design parameter) (e.g., NA=0.5); and $K_1$ is a first empirical process parameter (e.g., $K_1$=0.5). $K_1$ is a system process parameter which takes into account factors such as a finite resist thickness, partial coherency $\sigma$ (condenser lens NA/projection lens NA) of the optics, and pattern structures. In general, $K_1$ is equal to about 0.5 to about 0.6 for deep ultraviolet (DUV) ($\lambda$=248 nanometers) lithography.

An optical image degrades as the system is defocused, and the amount of defocusing that can be tolerated is called depth of focus (DOF). Increased DOF will minimize the adverse effect of slight deviations of the exposure tool from a best focus condition. The DOF may be expressed using the conventional Rayleigh equation as:

$$DOF = K_2 \frac{\lambda}{(NA)^2} \qquad (2)$$

where DOF is the depth of focus; $\lambda$ is the wavelength of the exposure light (e.g., $\lambda$=248 nanometers); NA is the numerical aperture (a lens design parameter) (e.g., NA=0.5); and $K_2$ is a second empirical process parameter (e.g., $K_2$=0.7). To take into account a finite resist thickness d, the DOF may be expressed as:

$$DOF = K_2 \frac{\lambda}{(NA)^2} - \frac{d}{n} \qquad (3)$$

where DOF is the depth of focus; $\lambda$ is the wavelength of the exposure light (e.g., $\lambda$=248 nanometers); NA is the numerical aperture (a lens design parameter) (e.g., NA=0.5); d is the thickness of the resist; n is the refractive index of the resist at the wavelength of the exposure light (i.e., 248 nanometers); and $K_2$ is a second empirical process parameter (e.g., $K_2$=0.7). See, for example, Arnold et al., Proc. SPIE 772, 21 (1987) and Boettiger et al., Microelectronics Engineering 23, 159 (1994).

In advanced lithography processes such as DUV lithography processes, the reduction of ground rules to quarter-micron or below requires a methodology for achieving higher resolution capability. However, improved resolution is obtained at the expense of depth of focus. Thus, for example, the higher the NA of the lens being used, the more difficult it is to keep the whole wafer properly focused. Accordingly, it would be desirable to provide a methodology for achieving higher resolution capability without sacrificing or degrading any process windows such as depth of focus.

SUMMARY OF THE INVENTION

In accordance with one aspect of the present invention, the above-identified problems may be addressed in a fabrication process for fabricating a substrate by utilizing a thin resist and an antireflective coating (ARC) film which is effective to reduce thin film interference effects and to provide relatively high etch resistance. In one embodiment, such a fabrication process includes a step of providing a substrate to be fabricated. An antireflective coating film, which may include films of two or more different materials, is then formed on the substrate. A thin resist is formed on the antireflective film and the resist is then patterned. The substrate is fabricated using the patterned resist as a mask.

In accordance with the present invention, resolution capability and depth of focus in a lithography process are improved by the use of a thin resist. In addition to these advantages in the lithography process, use of a thin resist further provides advantages in an etching process. That is, the use of a thin resist provides improved etch pattern profiles and micro-loading effect, as well as reduced optical proximity effect. The use of a thin resist further extends the advantages of higher NA exposure systems. Additionally, the use of a thin resist improves the process window of contact holes.

These and other features and advantages of the present invention will be readily apparent and fully understood from the following detailed description of the preferred embodiments, when read in conjunction with the appended drawings.

BRIEF DESCRIPTION OF THE DRAWINGS

FIGS. 1(a)–1(f) illustrate a pattern transfer process in accordance with an embodiment of the present invention.

FIGS. 4(a) and 4(b) illustrate a reflectivity simulation with no ARC film.

FIGS. 5(a) and 5(b) illustrate a reflectivity simulation with an organic ARC film.

FIGS. 6(a) and 6(b) illustrate a reflectivity simulation with an oxide/α-carbon complex ARC film.

FIG. 7 is a graph illustrating the relationship between depth of focus and resist thickness.

FIGS. 9(a) and 9(b) illustrate simulation results of dose-to-clear ($E_0$) monitor of APEX-E resist as functions of silicon dioxide substrate thickness and resist thickness with a silicon dioxide (50 nanometers)/carbon (100 nanometers) complex ARC film using a Micrascan II.

FIGS. 10(a) and 10(b) illustrate simulation results of dose-to-clear ($E_0$) monitor of APEX-E resist as functions of silicon dioxide substrate thickness and resist thickness with a 99 nanometer organic ARC film using an NSR-S201A.

FIGS. 12(a)–12(d) are a comparision of cross-sectional SEM profiles after etch (before resist strip) between (a) 610 nanometer APEX-E and (b) 850 nanometer APEX-E, on 90 nanometer organic ARC film over 785 nanometer silicon dioxide substrate for line/space 250/300 nanometer patterns (550 nanometer pitch).

FIGS. 13(a)–13(g) are schematic diagrams of cross-sectional views of different gate electrode pattern structures for evaluation of optical proximity effect in the lithography process and micro-loading effect in the etch process.

FIGS. 18(a) and 18(b) illustrate electrical test results of (a) 300 nanometer contact resistance and (b) 300 nanometer chain resistance with 500 nanometer APEX-E, 610 nanometer APEX-E, and 850 nanometer APEX-E, on 90 nanometer organic ARC film over 550 nanometer silicon dioxide substrate, respectively.

FIGS. 19(a)–19(f) are a comparison of cross-sectional SEM profiles after etch (before resist strip) among (a) 500 nanometer APEX-E, (b) 610 nanometer APEX-E, and (c) 850 nanometer APEX-E, on 90 nanometer organic ARC film over 550 nanometer silicon dioxide substrate, for contact holes with 300 nanometer diameter in resist.

FIGS. 20(a)–20(c) are cross-sectional SEM profiles of 200 nanometer equal lines and spaces (400 nanometer pitch) in 610 nanometer APEX-E on silicon dioxide (50 nanometer)/carbon (100 nanometer) complex ARC film over 500 nanometer silicon dioxide substrate (a) after Micrascan II exposure, (b) after silicon dioxide/carbon complex ARC film etch, and (c) pattern transfer after silicon dioxide substrate etch.

DETAILED DESCRIPTION

Figure 2A:
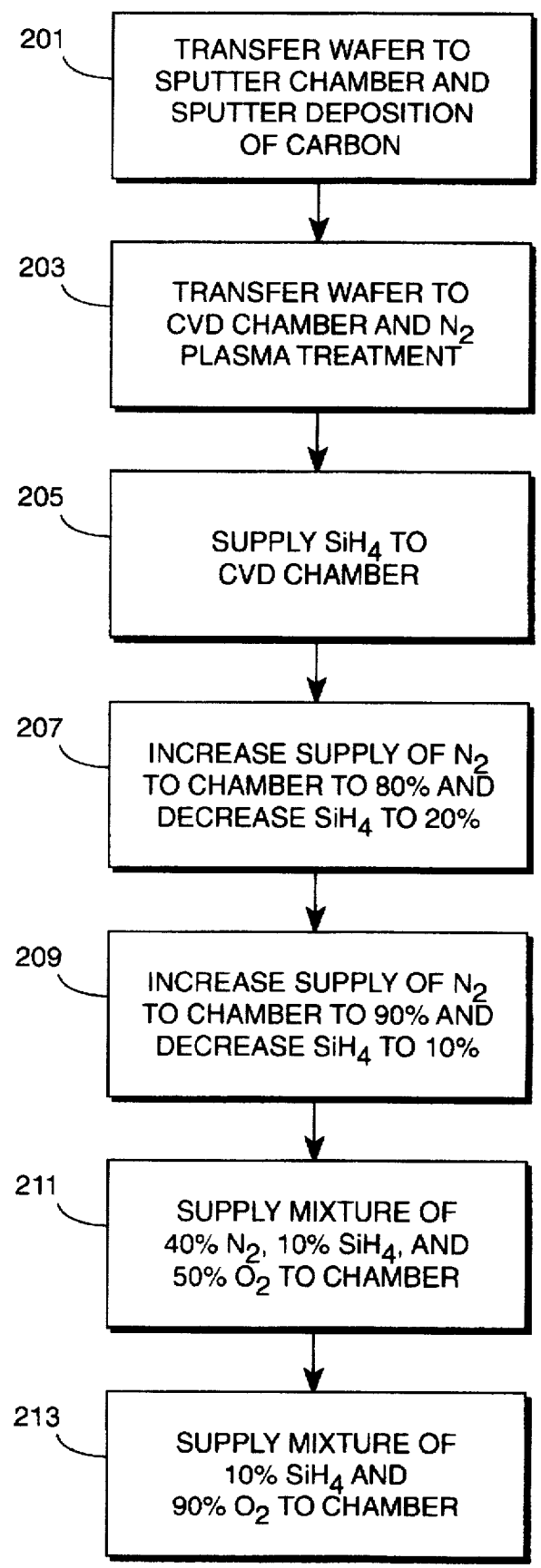
FIGS. 2(a)–2(c) illustrate the details of the oxide/carbon complex ARC film formation of FIG. 1(a).

A reduction in resist thickness simultaneously induces both a decrease in the $K_1$ factor of equation (1) and an increase in the $K_2$ factor of equations (2) and (3), without changing the wavelength λ of the exposure light and numerical apertures (NA) of the optics. Thus, the reduction of resist thickness provides improved resolution and DOF. Based on the experimental results described below, an alternative equation for depth of focus is proposed as follows:

$$DOF = K_2 \frac{\lambda}{(NA)^2} - (n-1)\left(\frac{d}{n}\right) \quad (4)$$

This equation provides good agreement with experimental data. In a more general sense, DOF depends not only on illumination conditions, including the partial coherency σ, but also on pattern structures and subsequent thin film interference effects. This may be expressed in equation form as:

$$DOF = 2D(p,c) - f(d)(d/n) \quad (5)$$

where D(p,c) is the defocus as a function of the aerial image contrast c of a particular pattern structure p (e.g., pitch); and f(d) is a modified damped oscillation curve with λ/2n period as a function of the resist thickness. f(d) may be expressed as follows:

$$f(d) = A + Bd + C\exp(-Dd)\cos[2\pi d/(\lambda/2n) + e] \quad (6)$$

where A, B, C, D, and E are constants. See Azuma et al., J. Vac. Sci. Technol. B13, 2928 (1995).

An adjustment of applied resist thicknesses to favorable values along the sinusoidal of the proposed DOF equation (4) is therefore desirable, whenever feasible. This feasibility is dependent on, for example, topography. For example, as shown in FIG. 7, a graph of DOF versus resist thickness shows sinusoidal variations due to thin film interference effects. Therefore, resist thicknesses corresponding to peak points A, B, and C can provide better DOF values than resist thicknesses corresponding to points D, E, and F. In order to obtain the advantage in DOF, the substrate should have little topography since resist thickness is highly dependent on the topography.

Thus, a thin resist process furnishes increased DOF as well as higher resolution capability in the lithography process. As will be described below, a thin resist process provides improved micro-loading effect in the etch process due to a lower aspect ratio. However, a thin resist process must take into account that a reduction in resist thickness can cause more serious thin film interference effects and, consequently, smaller dose latitude. Dose latitude refers to the amount of dose (expressed as a percentage) that can be tolerated while keeping a certain DOF. In addition, due to the reduction in thickness, a higher etch selectivity ratio is required so that the surface of the substrate to be fabricated is protected even after the etching process, whereby the surface of the substrate to be fabricated is not damaged by the etching process.

A process in accordance with an embodiment of the present invention will be described with reference to FIGS. 1(a)–1(f). The process will be described below in terms of a substrate to be fabricated. In the exemplary, but non-limiting, process described below, the substrate to be fabricated is a silicon dioxide ($SiO_2$) layer formed, for example, on a silicon substrate. However, the invention is not limited to the fabrication of any particular type of substrate and, in the field of semiconductor devices, is broadly applicable to the fabrication of any substrate, including the silicon substrate itself, during the device manufacturing process.

FIG. 1(a) shows a substrate 100 to be fabricated. In the presently described embodiment, substrate 100 is a silicon dioxide ($SiO_2$) substrate having a thickness of about 500 nanometers (nm). As noted above, however, the present invention is not limited in this respect. An antireflective coating (ARC) film 102 is then formed on the substrate 100. In the presently described embodiment, ARC film 102 is an oxide/carbon complex ARC film including a sputtered carbon (C) film 102a having a thickness of about 100 nanometers (nm) and a CVD silicon dioxide ($SiO_2$) film 102b having a thickness of about 50 nanometers. As will be discussed with respect to FIG. 2, a barrier film 102c of silicon nitride ($Si_3N_4$) (see FIG. 2(c)) may be provided between carbon film 102a and oxide film 102b. Of course, the invention is not limited to the particular thicknesses of the carbon film 102a and the oxide film 102b set forth above. The optical properties of carbon do not change significantly with changes in film thickness. Therefore, an upper limit for the carbon film thickness depends on how much the substrate must be etched using the carbon film as a mask. A lower limit for the carbon film thickness is simply a thickness which is sufficient to effectively reduce the reflectivity of the substrate. Among other reasons, oxide film 102b is provided to reduce footing of a subsequently applied resist caused by the tendency of some chemically amplified resists to show footing problems on carbon-like films. Thus, the thickness of oxide film 102b should be sufficient to suppress contamination of the applied resist from carbon film 102a. It is presently believed that a thickness of about 50 nanometers is sufficient for this purpose. In addition, as will become apparent from the further description below, oxide film 102b serves as a good pattern transfer medium between carbon film 102a and the applied resist because the etch rate of the applied resist relative to oxide is generally more than 10, the etch rate of oxide relative to carbon is generally more than 50, and the etch rate of oxide relative to carbon is generally about 20.

Figures 2B, 2C, 3:
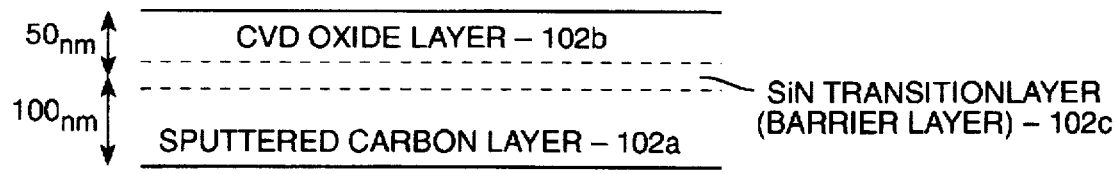
FIG. 3 is a table listing the refractive indices for various materials at 248 nanometers single band light.

With reference to FIGS. 2(a)–2(c), the oxide/carbon complex ARC film deposition process using, for example, an Endura system tool (available from Applied Materials, Inc.), will be described. The Endura system tool includes both a sputter deposition chamber and a CVD chamber. At step 201, the wafer having the substrate to be fabricated is transferred to a sputter deposition chamber where a sputter deposition is performed to deposit a carbon film 102a which is about 100 nanometers thick. At step 203, the wafer having the sputtered carbon film is transferred to a chemical vapor deposition (CVD) chamber and an $N_2$ plasma treatment of the sputtered carbon film 102a is carried out. As shown at step 205 and in the table of FIG. 2(b), pure $SiH_4$ is then supplied to the CVD chamber. Next, as shown at step 207 and in the table of FIG. 2(b), the supply of $N_2$ (alternatively, $NH_3$ may be used) to the CVD chamber is increased to 80% while the supply of $SiH_4$ is decreased to 20%. The supply of $N_2$ (or $NH_3$) to the CVD chamber is then increased to 90% while the supply of $SiH_4$ is decreased to 10% as indicated at step 209. At this time, a silicon nitride transition or barrier layer 102c is deposited. This transition layer is about 10 nanometers thick and serves, inter alia, to reduce reflectivity at the interface between carbon film 102a and oxide film 102b. Then, a mixture of 40% $N_2$ (or $NH_3$), 50% $O_2$, and 10% $SiH_4$ is supplied to the CVD chamber at step 211. Subsequently, a mixture of 90% $O_2$ and 10% $SiH_4$ is supplied to the CVD chamber and a CVD silicon dioxide ($SiO_2$) film 102b having a thickness of about 50 nanometers is deposited. The resulting complex oxide/carbon ARC film is shown in FIG. 2(c). The control of parameters such as pressure, temperature, and power associated with the above-described process steps will be dependent on factors such as the film thicknesses as will be apparent to those in the art. While the present invention is not limited to the specific oxide/carbon complex ARC film with transition layer and manufacturing process as described above, certain advantages may be achieved by its use. As noted, the transition layer, inter alia, reduces reflectivity at the interface between the carbon film and the oxide film. In addition, the use of a multi-chamber deposition system simplifies the deposition processes. Further, the oxide/carbon complex ARC provides a much better etch rate relative to both the substrate to be fabricated and to the applied resist. Moreover, the carbon film is a good optical match for an applied DUV resist and reduces reflectivity very effectively.

Returning to FIG. 1(b), a resist 104 having a thickness of between about 300 and about 850 nanometers is formed on ARC film 102. Resist 104 may, for example, be APEX-E or UVIIHS manufactured by Shipley. However, the invention may generally utilize any type of resist including by way of example, but not by way of limitation, chemically amplified resists, non-chemically amplified resists, positive-type resists, and negative-type resists. The resist is exposed using a mask which defines a pattern in resist 104. The exposure tool may be a Micrascan II available from SVGL, Inc. or an NSR-S201A available from Nikon Corp. The Micrascan II is a mercury-xenon short-arc lamp broad band illumination step-and-scan optical projection system with wavelengths of 244 through 252 nanometers ($\Delta\lambda=8$ nanometers) and NA=0.5 and σ=0.6. The NSR-S201A is a KrF excimer laser single band illumination step-and-scan optical projection system with a wavelength of 248 nanometers ($\Delta\lambda=0.8$ picometers) and NA=0.6 and σ=0.6. In more advanced lithography, a 198 nanometer single-band ArF excimer laser may be used. As shown in FIG. 1(c), the oxide film 102b is then etched. The oxide film may be etched by any conventional technique, e.g., a $CF_4/CHF_3/Ar$ mixed gas, using, for example, a UNITY 85 DRM etcher available from TEL Corp. or a LAM4500 Rainbow etcher available from LAM Research Corp. The etching selectivity of resist 104 to oxide layer 102b is relatively high. In this particular embodiment, resist 104 is etched at a rate which is about 10 times slower than a rate at which oxide layer 102b is etched. As shown in FIG. 1(d), carbon layer 102a is then etched using resist 104 and the etched oxide layer 102b as a mask. Carbon layer 102b may be etched by any conventional technique, e.g., $O_2$/Ar mixed gas, using, for example, a LAM4500 Rainbow etcher available from LAM Research Co. or an AME P5000 etcher available from Applied Materials, Inc. In this particular embodiment, oxide layer 102b is etched at a rate which is about 50 times slower than a rate at which carbon layer 102a is etched. When using an $O_2$/Ar mixed gas to etch the carbon, there is little difference in the etch rates of the carbon and the resist since the resist is mainly composed of carbon, hydrogen, and oxygen atoms and is therefore similar to the carbon film. Because of this similarity in etch rates, it is preferable to provide oxide interlayer 102b between resist 104 and carbon film 102a so that a patterned carbon mask will remain to enable etching of the substrate. As shown in FIG. 1(e), substrate 100 is then etched using the etched carbon layer 102a as a mask. The substrate may be etched by any conventional technique, e.g., a $CF_4$/$CHF_3$/Ar mixed gas. In this particular embodiment, carbon layer 102a is etched at a rate which is about 20 times slower than a rate at which substrate 100 is etched. As shown in FIG. 1(f), carbon ashing is then performed to remove the carbon layer 102a and leave patterned substrate 100.

Figure 4A:
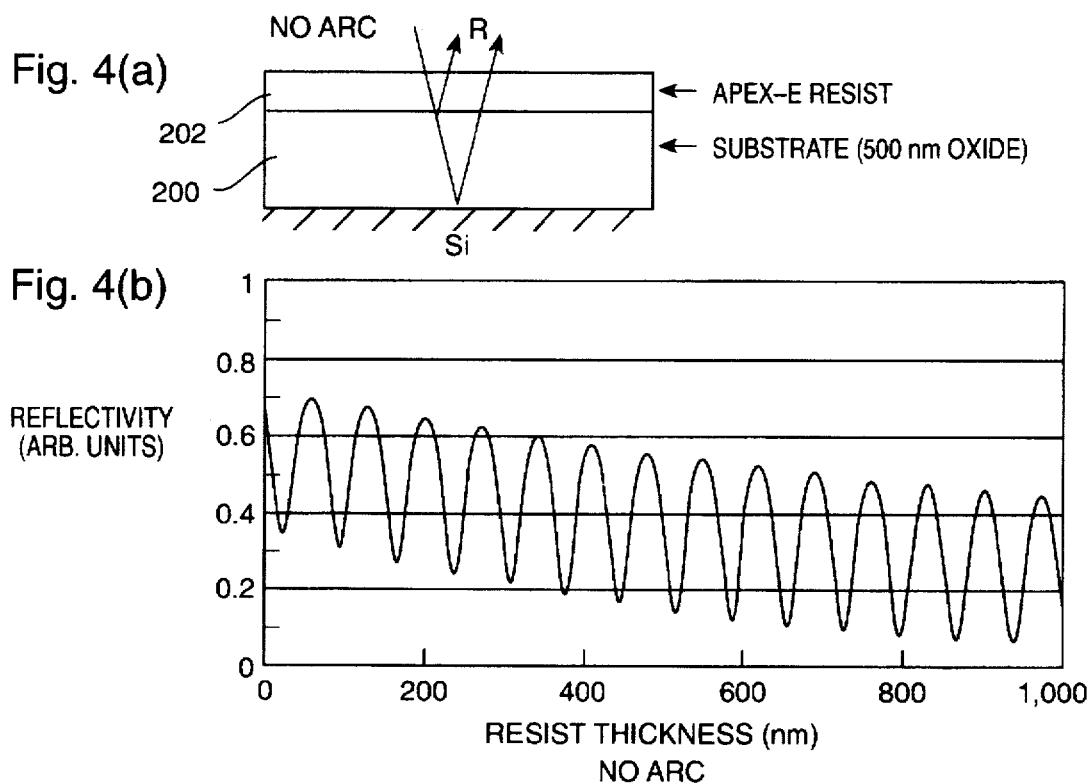
Figure 5A:
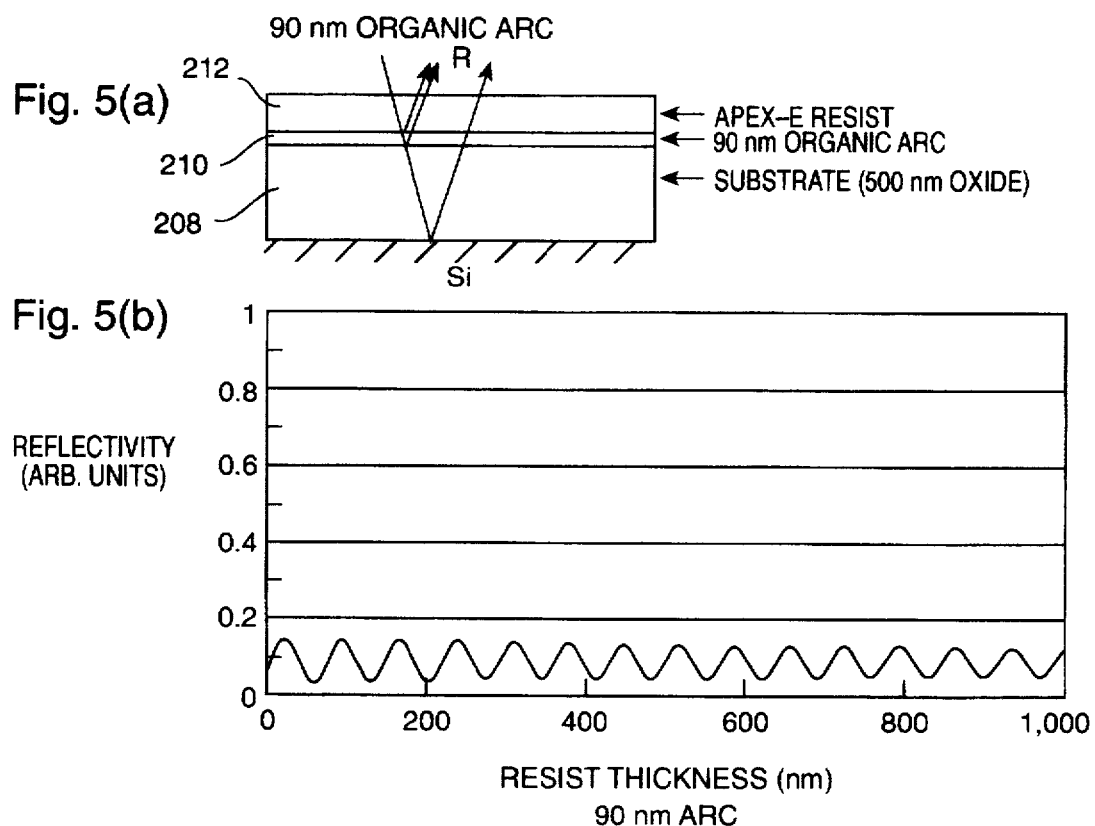

The table of FIG. 3 lists the refractive indices at 248 nanometers for materials used in the examples described below. FIG. 4(a) illustrates an APEX-E resist 202 formed on a substrate 200 of silicon dioxide having a thickness of 500 nanometers. FIG. 4(b) is a graph based on a simulation which illustrates the relationship between reflectivity and resist thickness in the case where no ARC film is provided. FIG. 5(a) illustrates an organic ARC film 210 (available, for example, from Shipley or Brewer Science) having a thickness of 90 nanometers and an APEX-E resist 212 successively formed on a substrate 208 of silicon dioxide having a thickness of 500 nanometers. FIG. 5(b) is a graph based on a simulation which illustrates the relationship between reflectivity and resist thickness in the case where the organic ARC film 210 having a thickness of 90 nanometers is provided. It can be seen that the provision of the organic ARC film 210 as in FIG. 5(a) reduces the reflectivity as compared with the arrangement of FIG. 4(a). FIG. 6(a) illustrates an oxide/carbon complex ARC film 222 and an APEX-E resist film 224 successively formed on a substrate 226 of silicon dioxide having a thickness of 500 nanometer. The oxide/carbon complex ARC film includes an α-carbon (amorphous carbon) film having a thickness of 100 nanometers and a silicon dioxide film having a thickness of 50 nanometers. FIG. 6(b) is a graph based on a simulation which illustrates the relationship between reflectivity and resist thickness in the case where the oxide/carbon complex ARC used. As can be seen, the provision of an oxide/carbon complex ARC film 222 also reduces reflectivity as compared with the arrangement of FIG. 4(a). While the arrangements of FIGS. 5(a) and 6(a) provide comparable effectiveness with respect to reducing reflectivity, the oxide/carbon complex ARC film is much more advantageous in etching selectivity when the above-described pattern transfer process is utilized. The organic ARC film has a significant disadvantage in etching selectivity even if the above-described pattern transfer process is not utilized.

FIG. 7 illustrates the relationship between depth of focus and resist thickness in the case where no ARC film is used and where an oxide/carbon complex ARC film is used. As can be seen, in both cases, the depth of focus increases as the resist thickness decreases. However, the complex ARC film eliminates the sinusoidal variation due to thin film interference effects. Thus, in accordance with the present invention, the depth of focus may be increased without causing any thin film interference effects. In addition, as described above, the complex ARC of the invention also provides high selectivity etching.

The examples set forth in detail below verify the potential capabilities of the thinner resist process in the thickness range of 300 to 850 nanometers using advanced deep ultraviolet exposure systems in combination with several chemically amplified resist and bottom ARC materials for both the lithography and the etch processes. The experimental results for lines and spaces indicate that a larger gain in process window accompanies reduced resist thickness. It was further found that the thinner resist process could provide advantages not only in the lithography process, but also in the etching process. That is, the thinner resist process improved etch pattern profiles and micro-loading effect, as well as reduced optical proximity effect. It was also demonstrated that the application of the thinner resist process would be useful to further extend advantages of higher NA exposure systems. The thinner resist process was also found to be effective to improve process window of contact holes. More stable electrical test results of contact resistance and contact chain resistance were derived from the thinner resist process, assuming that sufficient resist remained after etch. In addition, the pattern transfer process described above demonstrated resolution capability down to the practical limit at $k_1$=0.4. These results indicate that advantages in process window result from the thinner resist process, provided that the applied resist thickness exceeds the lower limit of resist thickness mainly imposed by the etch process.

The examples set forth below are intended to be illustrative and are not intended to limit this invention. For example, while the examples describe a single layer resist technique, the invention may also be utilized with multi-layer resists. Multi-layer resists may be appropriate in more advanced lithography techniques using an ArF (193 nanometer wavelength) excimer laser.

EXAMPLES

Two positive types of chemically amplified deep ultraviolet resist films were coated in the thickness range of 300 to 850 nanometers over an organic bottom ARC film or an inorganic bottom ARC film (silicon dioxide/carbon complex ARC film) on an 8-inch stacked substrate wafer. The resist types used were APEX-E and UVIIHS available from Shipley. Exposure tools used were a mercury-xenon short-arc lamp broad band illumination step-and-scan optical projection system with wavelengths of 244 through 252 nanometers (Δλ=8 nanometers), an NA=0.5 and a σ=0.6 (available as the Micrascan II from SVGL, Inc.), and a KrF excimer laser single band illumination step-and-scan optical projection system with a wavelength of 248 nanometers (Δλ=0.8 picometers), NA=0.6, and σ=0.6 (available as the NSR-S201A from Nikon Corp). Etch tools used were the LAM4500 Rainbow (for etching the bottom ARC and silicon dioxide) available from LAM Research Corp.; AME P5000 (for etching the bottom ARC and silicon nitride) available from Applied Materials, Inc.; UNITY 84DRM (for etching tungsten polycide gate electrode) available from TEL Corp.; and UNITY 85DRM (for etching silicon dioxide) available from TEL Corp. Resist patterns and subsequent substrate profiles after etch were measured using a top-down scanning electron microscope (SEM) and a cross-sectional SEM. Each process window in the lithography process and the etch process was then compared using exposure-defocus plots (ED-tree) for a critical dimension (CD) of ±25 nanometers (±10% of a quarter micron).

Example 1

Figures 8A, 8B:
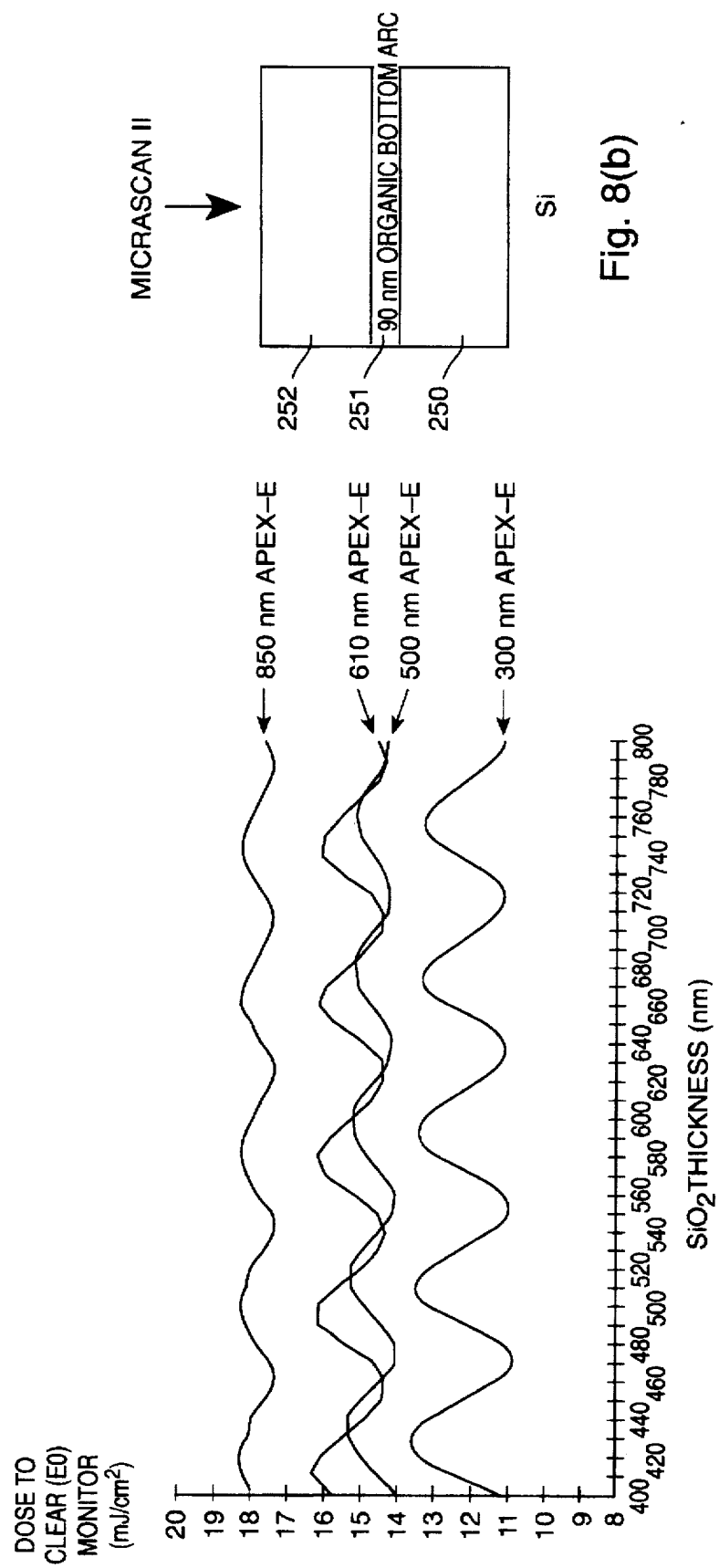
FIGS. 8(a) and 8(b) illustrate simulation results of dose-to-clear ($E_0$) monitor of APEX-E resist as functions of silicon dioxide substrate thickness and resist thickness with a 90 nanometer organic ARC film using a Micrascan II.
Figure 9B:
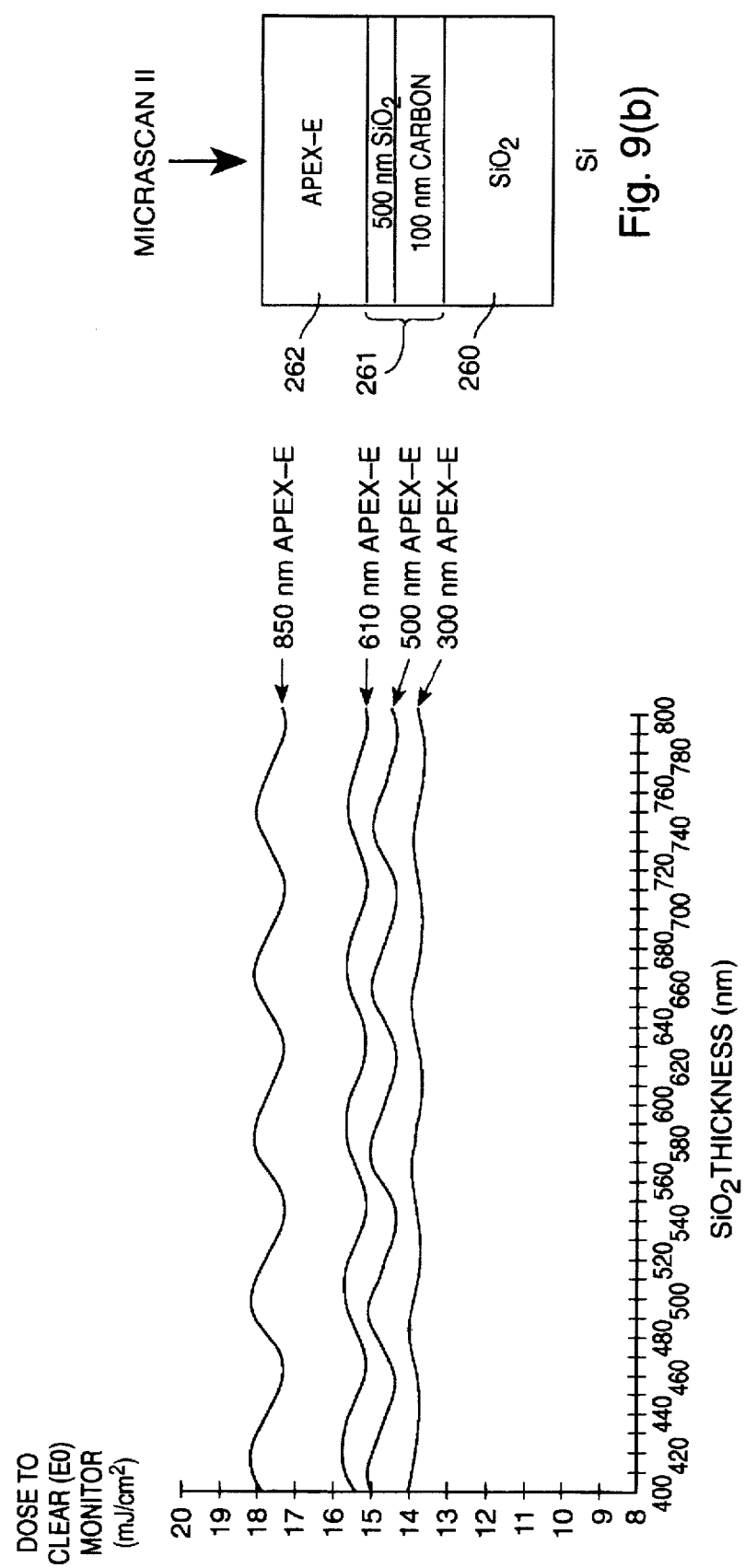

FIGS. 8–10 show simulation results of dose-to-clear ($E_0$) monitor of APEX-E resist as functions of silicon dioxide substrate thickness and resist thickness. Dose-to-clear refers to a dose $E_0$ required to open a large pad area in the case of a positive type resist. In the case of a negative type resist, it refers to a dose required to leave behind a large pad area. FIG. 8(a) shows the results for the stacked structure of FIG. 8(b) (namely, a silicon dioxide substrate 250, a 90 nanometer organic bottom ARC film 251, and an APEX-E resist 252) using the Micrascan II. FIG. 9(a) shows the results for the stacked structure of FIG. 9(b) (namely, a silicon dioxide substrate 260, a carbon (100 nanometers)/oxide (50 nanometers) complex ARC film 261, and an APEX-E resist 262) using the Micrascan II. FIG. 10(a) shows the results for the stacked structure of FIG. 10(b) (namely, a silicon dioxide substrate 270, a 99 nanometer organic ARC film 271, and an APEX-E resist 272) using the NSR-S201A. For each curve in FIGS. 8(a), 9(a), and 10(a), calculations were made for the minimum bottom ARC film thicknesses required to achieve optimum results depending on the stacked substrate structures and the exposure systems. The averaged refractive indices of the APEX-E resist, organic bottom ARC film, and carbon film for the wavelengths employed were used.

$n_{APEX-E}=1.76-0.08i$ $n_{ARC}=1.95-0.26i$ $n_{CARBON}=1.75-0.50i$

Example 2

Figure 11:
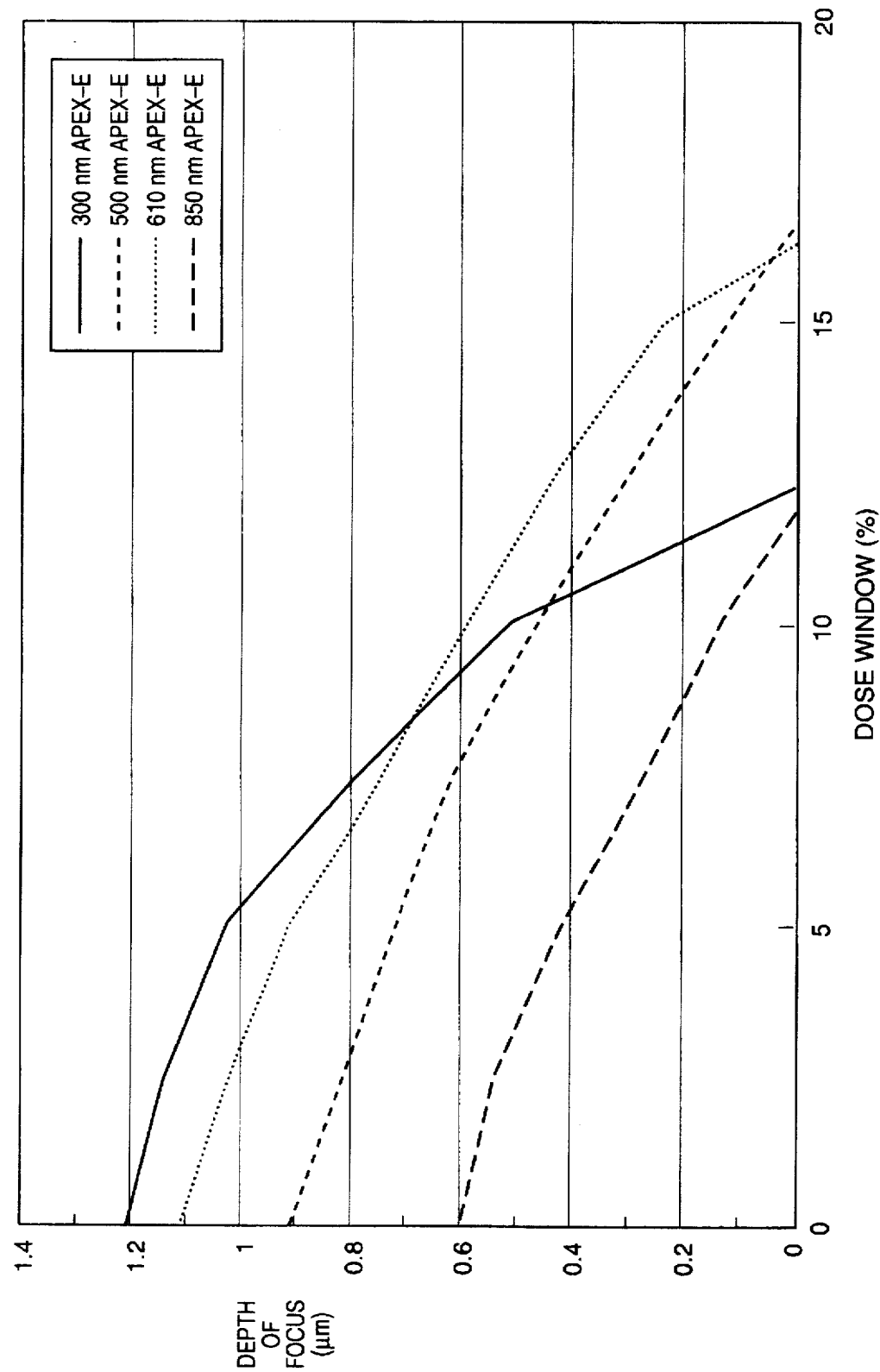
FIG. 11 illustrates the process window dependency on APEX-E resist thicknesses ranging from 850 to 300 nanometers, on 90 nanometer organic ARC film over 785 nanometer silicon dioxide substrate, for line/space=250/300 nanometer patterns (550 nanometer pitch) using electrical linewidth measurements after Micrascan II exposure.

A process window dependency on APEX-E resist thicknesses ranging from 300 to 850 nanometers for line/space= 250/300 nanometer patterns (550 nanometer pitch), on 90 nanometer organic bottom ARC film over 785 nanometer silicon dioxide, was derived from Micrascan II exposure and then electrical linewidth measurements employing a damascene process (i.e., a metal wiring fabrication process), as shown in FIG. 11. The organic bottom ARC film and silicon dioxide etcher (LAM 4500 Rainbow) which was used had sufficient silicon dioxide/APEX-E etch selectivity, even in the case of 300 nanometer APEX-E because of the relatively shallow etch depth (200 nanometers) of the silicon oxide substrate. According to the simulation results in FIG. 8(a), $E_0$ values in the swing curves of 500 nanometer APEX-E and 610 nanometer APEX-E cross over around 785 nanometer silicon dioxide thickness range. These differences in the swing curve behavior could explain the inconsistent trend of the DOF as a function of resist thickness, as observed experimentally for that particular silicon dioxide thickness. Although the DOF under optimum dose condition increases with decreasing resist thickness when comparing 300 nanometer APEX-E, 610 nanometer APEX-E, and 850 nanometer APEX-E, the DOF of 610 nanometer APEX-E is higher than that of 500 nanometers shown in FIG. 11. The relatively lower nominal dose window for 300 nanometer APEX-E might be due to more serious thin film interference.

Example 3

FIGS. 12(a)–12(d) show a comparison of the cross-sectional SEM profiles after etch (before resist strip) between 610 nanometer APEX-E and 850 nanometer APEX-E on 90 nanometer organic bottom ARC film over 785 nanometer silicon dioxide substrate under the same experimental conditions as for FIG. 11 (example 2). It was found that both bows in resist sidewalls after etch and bottom oxides of 850 nanometer APEX-E became less pronounced due to reduction of aspect ratio when 610 nanometer APEX-E was used.

Example 4

Figure 14:
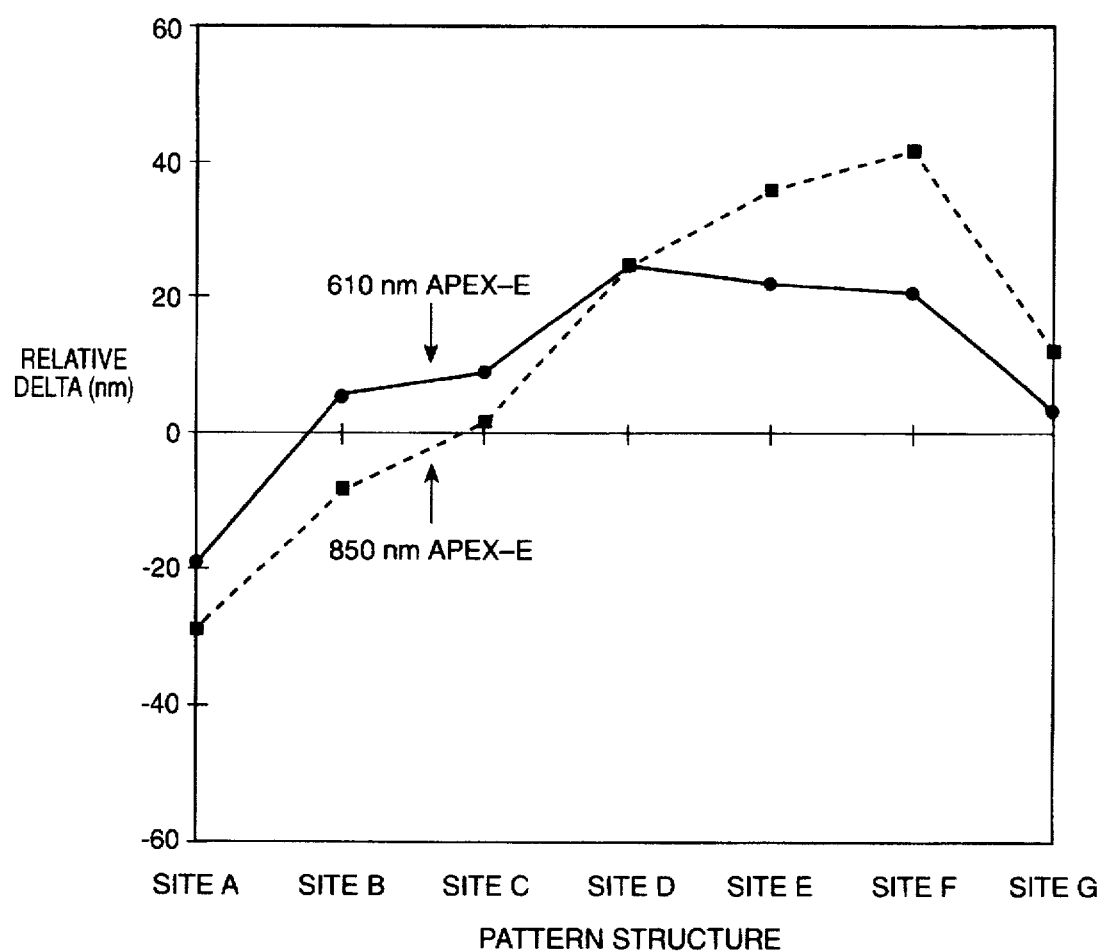
FIG. 14 illustrates the impact of reduced resist thickness on optical proximity effect in the lithography process for 610 nanometer APEX-E on 90 nanometer organic ARC film and 850 nanometer APEX-E on 45 nanometer organic ARC film, over tungsten polycide gate electrode substrate, based on top-down SEM measurements after lithography.
Figure 15:
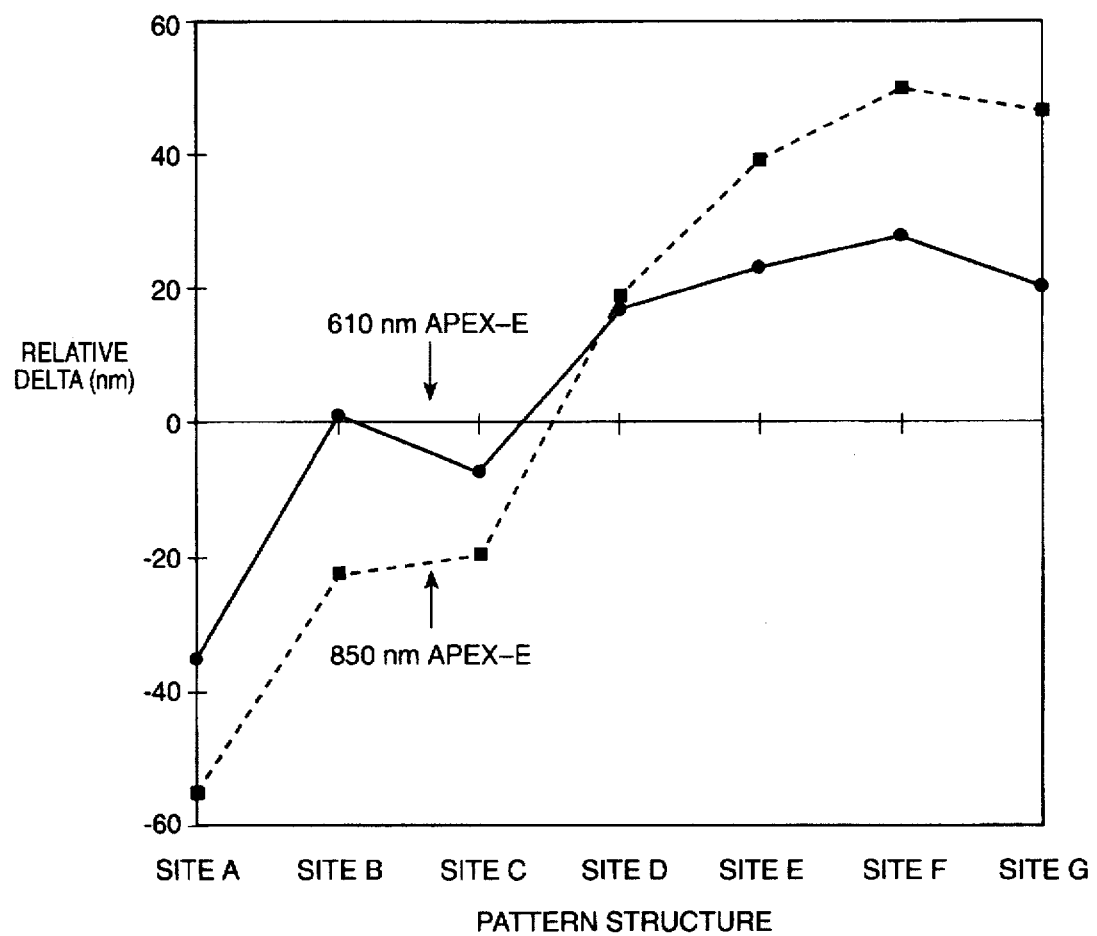
FIG. 15 illustrates the impact of reduced resist thickness on micro-loading effect in the etch process for 610 nanometer APEX-E on 90 nanometer organic ARC film and 850 nanometer APEX-E on 45 nanometer organic ARC film, over tungsten polycide gate electrode substrate, referred to electrical linewidth measurements after tungsten polycide gate electrode pattern fabrication.

The impact of reduced resist thickness on optical proximity effect in lithography process and on micro-loading effect in etch process were investigated for different gate electrode pattern structures, as shown in FIGS. 13(a)–13(g), using (1) an 850 nanometer APEX-E on 45 nanometer organic bottom ARC film or (2) a 610 nanometer APEX-E on a 90 nanometer organic bottom ARC film, over a tungsten polycide gate electrode substrate and Micrascan II exposure. FIG. 14 shows the impact of reduced resist thickness on optical proximity effect in the lithography process. All relative delta CD values (i.e., relative variations or deviations of critical dimension values from a target) in FIG. 14 are based on top-down SEM measurements after lithography. FIG. 15 shows the impact of reduced resist thickness on microloading effect in the etch process. All relative delta CD values in FIG. 15 refer to electrical linewidth measurements after tungsten polycide gate electrode pattern fabrication by means of the bottom ARC film and silicon nitride etcher (AME P5000) and tungsten polycide gate electrode etcher (UNITY 84DRM). Both experimental results of FIGS. 14 and 15 indicate that all relative delta CD values of 610 nanometer APEX-E on 90 nanometer organic bottom ARC film are smaller than those of 850 nanometer APEX-E on 45 nanometer organic ARC film in all kinds of gate electrode pattern structures. Thus, the thinner resist pattern was found to successfully improve not only optical proximity effect in lithography process, but also micro-loading effect in etch process.

Example 5

Figure 16A:
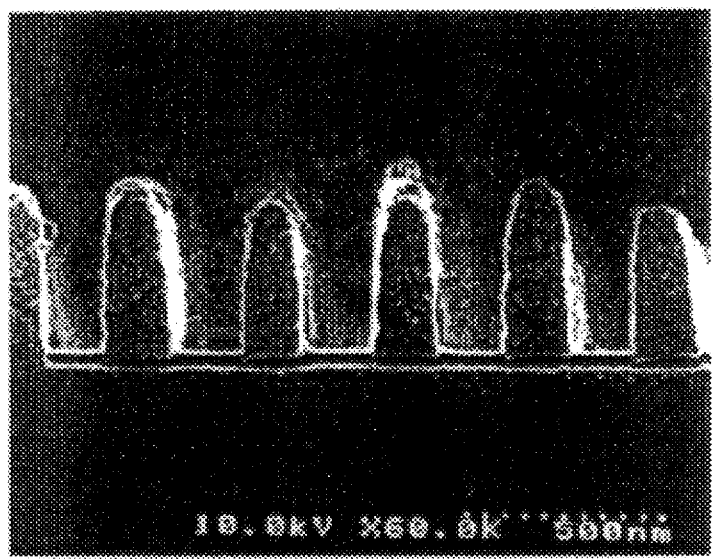
FIGS. 16(a) and 16(b) are cross-sectional SEM profiles of 175 nanometer equal lines and spaces (350 nanometer pitch) both in (a) 610 nanometer APEX-E and in (b) 610 nanometer UVIIHS, on 99 nanometer organic ARC film over bare silicon substrate, using an NSR-S201A.
Figure 16B:
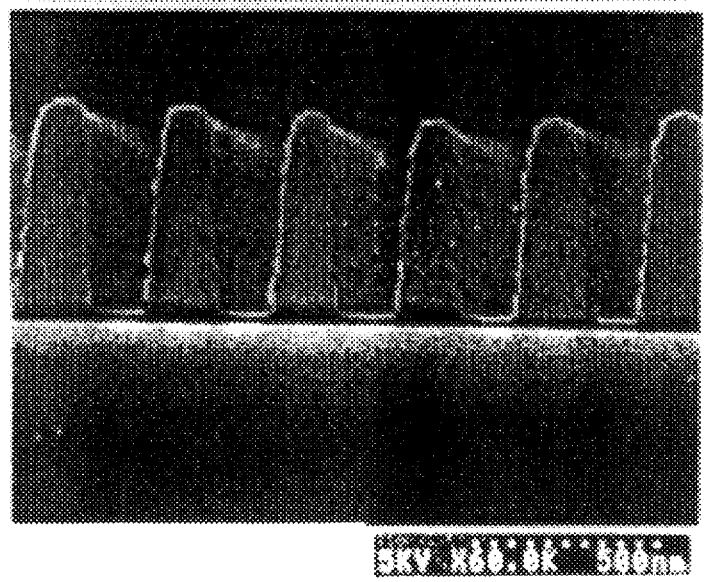

As an example of ultimate resolution capability of the conventional single layer resist technique, a combination of the thinner resist process and higher NA exposure system, NSR-S201A, with an NA=0.6 and a σ=0.6 was able to narrowly resolve 175 nanometer equal lines and spaces (350 nanometer pitch). Design rules of 1 Gigabit DRAM generation were resolved both in 610 nanometer APEX-E and 610 nanometer UVIIHS on 99 nanometer organic bottom ARC film over a bare silicon substrate as shown in FIGS. 16(a) and 16(b) (i.e., $k_1$=0.42). The 1 Gbit DRAM ground rules are currently said to be 175 nanometers. However, in the production stage, the ground rules may be 150 nanometers. Depending on the circuit design, the pitch should be about twice the ground rules. On the other hand, using thicker resists of 850 nanometer APEX-E and 850 nanometer UVI-IHS on 99 nanometer organic bottom ARC over bare silicon, the 1 Gigabit DRAM ground rules could not be resolved adequately. In such single band illumination systems with higher NA, an adjustment of applied resist thickness to favorable values along the swing curve should become more important as shown in FIG. 10(a). Specifically, resist thicknesses corresponding to peak points in the swing curve should be more desirable since the peak points have less thin film interference in the resist. Less thin film interference provides better process windows, such as DOF, resolution, and dose latitude.

Example 6

Figure 17:
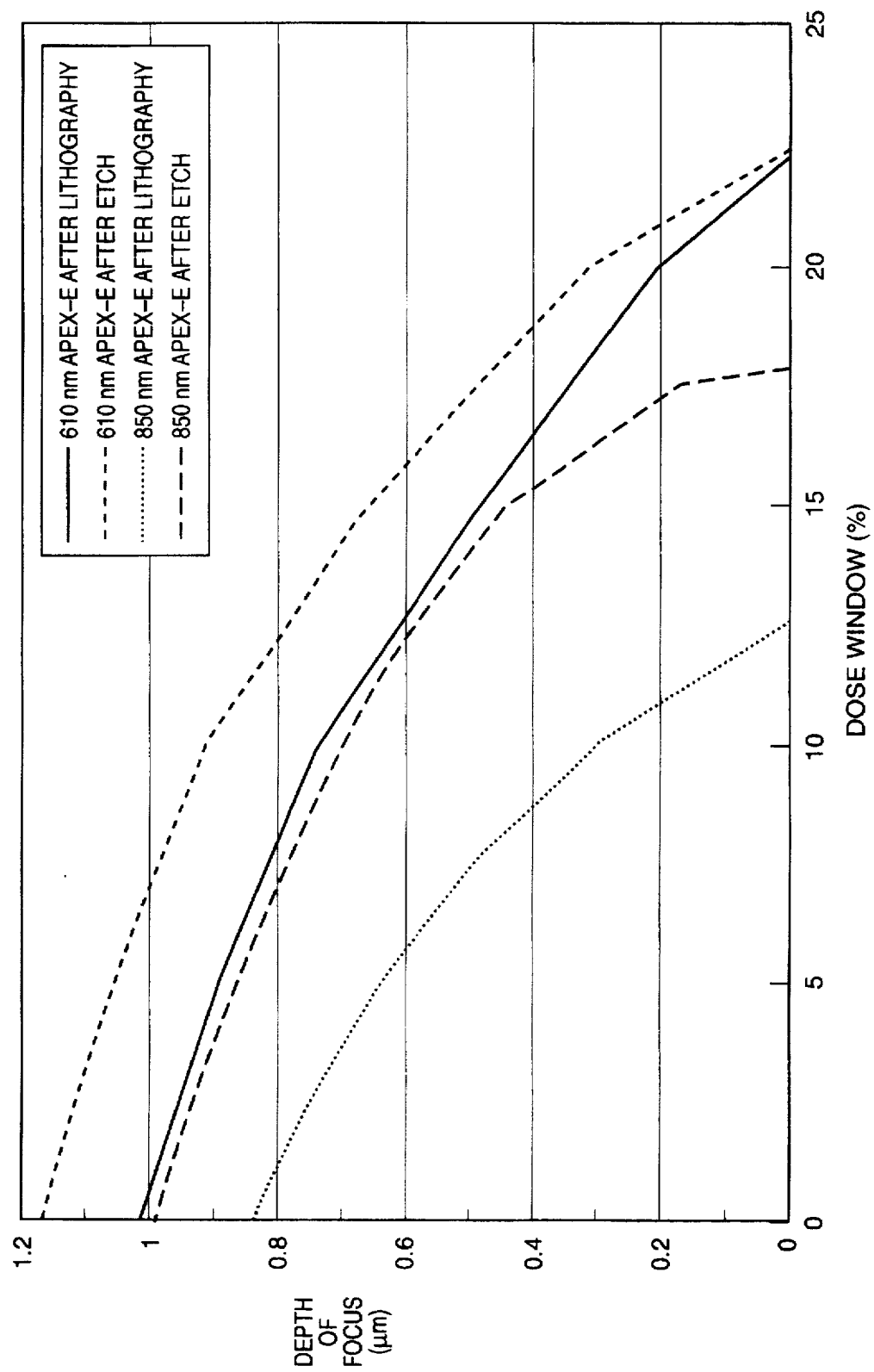
FIG. 17 is a process window comparison of contact holes between 610 nanometer APEX-E and 850 nanometer APEX-E, on 90 nanometer organic ARC film over 700 nanometer silicon dioxide substrate, for both after lithography (300 nanometer CD target) and after etch (330 nanometer CD target).

FIG. 17 shows a process window comparison for contact holes with a 300 nanometer diameter in resist (330 nanometer diameter after etch) between 610 nanometer APEX-E and 850 nanometer APEX-E on 90 nanometer organic bottom ARC film,over 700 nanometer silicon dioxide, both after lithography and after etch. Wafers were exposed using Micrascan II and were then etched using the AME P5000 (bottom ARC etcher) and the UNITY 85DRM (silicon dioxide etcher). All CD values of contact holes both after lithography and after etch were measured using the cross-sectional SEM. The experimental results indicate that the application of thinner resist process was very effective to improve the process window of contact holes. Assuming that the CD target of the contact holes with 300 nanometer in diameter should be 330 nanometer in diameter after etch, both process windows of 610 nanometer APEX-E and 850 nanometer APEX-E after etch were enhanced. The fact that the DOF increase of 610 nanometer APEX-E after etch was smaller than that of 850 nanometer APEX-E after etch may be the result of differences in etch conditions employed (e.g., overetch time).

Example 7

FIGS. 18(a) and 18(b) show electrical test results of contact resistance and contact chain resistance, respectively, for 500 nanometer APEX-E, 610 nanometer APEX-E, and 850 nanometer APEX-E on 90 nanometer organic bottom ARC film, over 550 nanometer silicon dioxide (on tungsten wiring patterns). The contact holes with 300 nanometer diameter were fabricated using the Micrascan II, the LAM4500 Rainbow, and liner Ti/TiN and tungsten filling with the CMP process. It was found that the thinner resist process could provide more stable contact resistance and contact chain resistance. The contact resistance and the contact chain resistance of 500 nanometer APEX-E, however, appears slightly less stable than those of 610 nanometer APEX-E. This is believed to be due to the problem of insufficient remaining resist thickness after etch, as shown in FIGS. 19(a)-19(f).

Example 8

With reference to FIG. 20, a pattern transfer process was carried out using an oxide/carbon complex ARC film. As shown in FIG. 20(a), 200 nanometer equal lines and spaces (400 nanometer pitch) were successfully resolved in 610 nanometer APEX-E resist on a CVD silicon dioxide/sputtered carbon 50/100 nanometer complex ARC film over a 500 nanometer silicon dioxide substrate using a Micrascan II having NA=0.5 and σ=0.6. In addition, 200 nanometer equal lines and spaces were successfully transferred to the 500 nanometer silicon dioxide substrate using a combination of the AME P5000 and UNITY 85DRM etch tools. The sputtered carbon film exhibited excellent antireflective performance without the need for precise thickness control, provided a minimum thickness for effective antireflective performance was used. The carbon film moreover provides much higher etch selectivity to the substrate (i.e., silicon dioxide) as shown in FIG. 20(c). A 50 nanometer silicon dioxide interlayer between the 610 nanometer APEX-E resist and the 100 nanometer carbon film over the 500 nanometer silicon dioxide substrate eliminated serious resist footing of the APEX-E patterns due to contamination of the carbon film. Although the silicon dioxide/carbon complex ARC process is believed to have reached a practical limit of resolution capability (i.e., $K_1$=0.4), an interlayer matched in its optical properties more precisely to the resist could widen the process window.

The present invention has been described in terms of the preferred embodiments thereof. Other embodiments, variations and modifications within the scope and spirit of the appended claims will occur to persons of ordinary skill in the art upon reviewing this disclosure.

We claim:

1. A fabrication process, comprising the steps of:
   providing a substrate to be fabricated;
   forming a multi-layer antireflective layer on said substrate;
   forming a patterned resist having a thickness less than 850 nanometers on said multi-layer antireflective layer; and
   fabricating said substrate using said patterned resist as a mask.

2. The process of claim 1, wherein the step of fabricating said substrate comprises etching said substrate.

3. The process of claim 1, wherein said multi-layer antireflective layer comprises a carbon layer and an oxide layer.

4. The process of claim 3, wherein said multi-layer antireflective layer further comprises a transition layer between said carbon layer and said oxide layer.

5. The process of claim 3, wherein said carbon layer has a thickness of about 100 nanometers.

6. The process of claim 3, wherein said oxide layer has a thickness of about 50 nanometers.

7. The process of claim 1, wherein said patterned resist has a thickness of about 610 nanometers.

8. The process of claim 1, wherein said patterned resist is a chemically amplified resist.

9. The process of claim 1, wherein said substrate is an insulating material.

10. The process of claim 1, wherein said substrate is a conducting material.

11. The process of claim 1, wherein said substrate is a semiconducting material.

12. The process of claim 1, wherein the fabrication process is a deep ultraviolet fabrication process.

13. The process of claim 1, wherein the resist has a thickness in a range of about 300 nanometers to about 850 nanometers.

14. A fabrication process, comprising the steps of:
   providing a substrate to be fabricated;
   forming a multi-layer antireflective layer on said substrate;
   forming a patterned resist having a thickness of between about 300 and about 850 nanometers on said multi-layer antireflective layer; and
   fabricating said substrate using said patterned resist as a mask.

15. The process of claim 14, wherein said multi-layer antireflective layer comprises a carbon layer and an oxide layer.

16. The process of claim 15, wherein said multi-layer antireflective layer further comprises a transition layer between said carbon layer and said oxide layer.

17. The process of claim 16, wherein said transition layer comprises silicon nitride.

* * * * *